United States Patent [19]

Suyama et al.

[11] Patent Number: 5,731,630
[45] Date of Patent: Mar. 24, 1998

[54] TAPE CARRIER FOR INCREASING THE NUMBER OF TERMINALS BETWEEN THE TAPE CARRIER AND A SUBSTRATE

[75] Inventors: Takayuki Suyama; Shinichi Hasegawa, both of Tokyo, Japan

[73] Assignee: NEC Corporation, Tokyo, Japan

[21] Appl. No.: 403,626

[22] Filed: Mar. 14, 1995

[30] Foreign Application Priority Data

May 31, 1994 [JP] Japan .................... 6-118224

[51] Int. Cl.⁶ .................................. H01L 23/48
[52] U.S. Cl. .................... 257/701; 257/737; 257/778
[58] Field of Search ........................ 257/778, 737, 257/701, 679, 692

[56] References Cited

U.S. PATENT DOCUMENTS

| | | | |
|---|---|---|---|
| 5,350,947 | 9/1994 | Takekawa et al. | 257/737 |
| 5,352,926 | 10/1994 | Andrews | 257/778 |
| 5,367,435 | 11/1994 | Andros et al. | 361/749 |

FOREIGN PATENT DOCUMENTS

| | | |
|---|---|---|
| 2673043 | 8/1992 | France . |
| 64-81330 | 3/1989 | Japan . |
| 258245 | 2/1990 | Japan . |
| 2185051 | 7/1990 | Japan . |
| 6140462 | 5/1994 | Japan . |

OTHER PUBLICATIONS

"Thin Film Module"; IBM Technical Disclosure Bulletin, Jan. 1989, pp. 135–138.

R. Tummala et al.; "Microelectronics Packaging Handbook", pp. 409–424.

"All of the printed wiring board 91' (Purinto Haisenban no Subete 91')"; Nikkan Kogyo Shinbunsha, Tokyo 1991, pp. 170–171.

Primary Examiner—Minh-Loan Tran
Assistant Examiner—Roy Potter
Attorney, Agent, or Firm—Whitham, Curtis, Whitham & McGinn

[57] ABSTRACT

A tape carrier for increasing the number of terminals between the tape carrier and a substrate includes a film, a lead, a terminal and a connection. The film has first and second surfaces and includes first and second regions. The first region of the film is covered with a device when the device is received by the first surface of the film. The film has an opening between the first and second regions. The lead is provided on the first surface of the film and extends above the opening of the film. The lead is coupled to the device at the opening of the film when the device is received by the first surface of the film. The terminal is provided on the second surface in the first region of the film. The connection connects the lead to the terminal. The lead and the device are connected together by thermocompression bonding with a thermode inserted into the opening of the film.

20 Claims, 8 Drawing Sheets

TAPE CARRIER FOR INCREASING THE NUMBER OF TERMINALS BETWEEN THE TAPE CARRIER AND A SUBSTRATE

BACKGROUND OF THE INVENTION

The present invention relates to a tape carrier used in tape automated bonding (TAB), and more particularly to a tape carrier for increasing the number of the terminals for connection to a substrate.

A conventional tape carrier is described in Rao R. Tummala and Eugene J. Rymaszewski, "Microelectronics Packaging Handbook", pp. 409–424.

Referring to FIG. 6-39 on page 411 of this reference, the conventional tape carrier has a central opening for receiving a thermode that thermocompression bonds inner leads of the tape carrier and terminals of a chip. Referring to FIG. 6-41 on page 412 of the above reference, outer leads of the tape carrier are connected to a substrate.

In this structure, the central opening prevents the tape carrier from increasing the number of terminals (i.e., the outer leads) between the tape carrier and the substrate because terminals cannot be provided in the central portion of the tape carrier.

Referring to FIG. 6-49 on page 422 of the above reference, another conventional tape carrier known as an area TAB has terminals in the central portion thereof. However, these terminals do not increase the number of terminals between the tape carrier and the substrate because they connect the chip to the tape carrier.

SUMMARY OF THE INVENTION

In view of the above problems of the conventional tape carriers, an object of the present invention is to provide a tape carrier which has terminals in a region covered by a semiconductor device. The terminals connect the tape carrier to a substrate.

Another object of the present invention is to allow the aforementioned tape carrier to be bonded by thermocompression bonding with a thermode.

Another object of the present invention is to shorten the total wiring length within the tape carrier.

Yet another object of the present invention is to suppress power supply noise generated from the tape carrier by reducing the inductance of a power supply and the ground.

A tape carrier according to the present invention comprises a film, a first lead, a first terminal and a first connection.

The film has first and second surfaces and includes first and second regions. The first region of the film is covered with a device when the device is received by the first surface of the film. The film has an opening between the first and second regions.

The first lead is provided on the first surface of the film and extends above the opening of the film. The first lead is coupled to the device at the opening of the film when the device is received by the first surface of the film.

The first terminal is provided on the second surface in the first region of the film. The first connection connects the first lead to the first terminal.

The first leads and the device are preferably connected together by thermocompression bonding with a thermode inserted into the opening of the film.

The number of terminals of the aforementioned tape carrier is increased due to the first terminals provided in the first region of the film in which terminals cannot be provided in conventional tape carriers.

BRIEF DESCRIPTION OF THE DRAWINGS

Other objects, features and advantages of the present invention will become more apparent when the following description is read in conjunction with the accompanying drawings, wherein.

In these drawings, the same reference numerals depict the same parts, respectively.

DETAILED DESCRIPTION OF THE PREFERRED EMBODIMENTS

Figure 1:
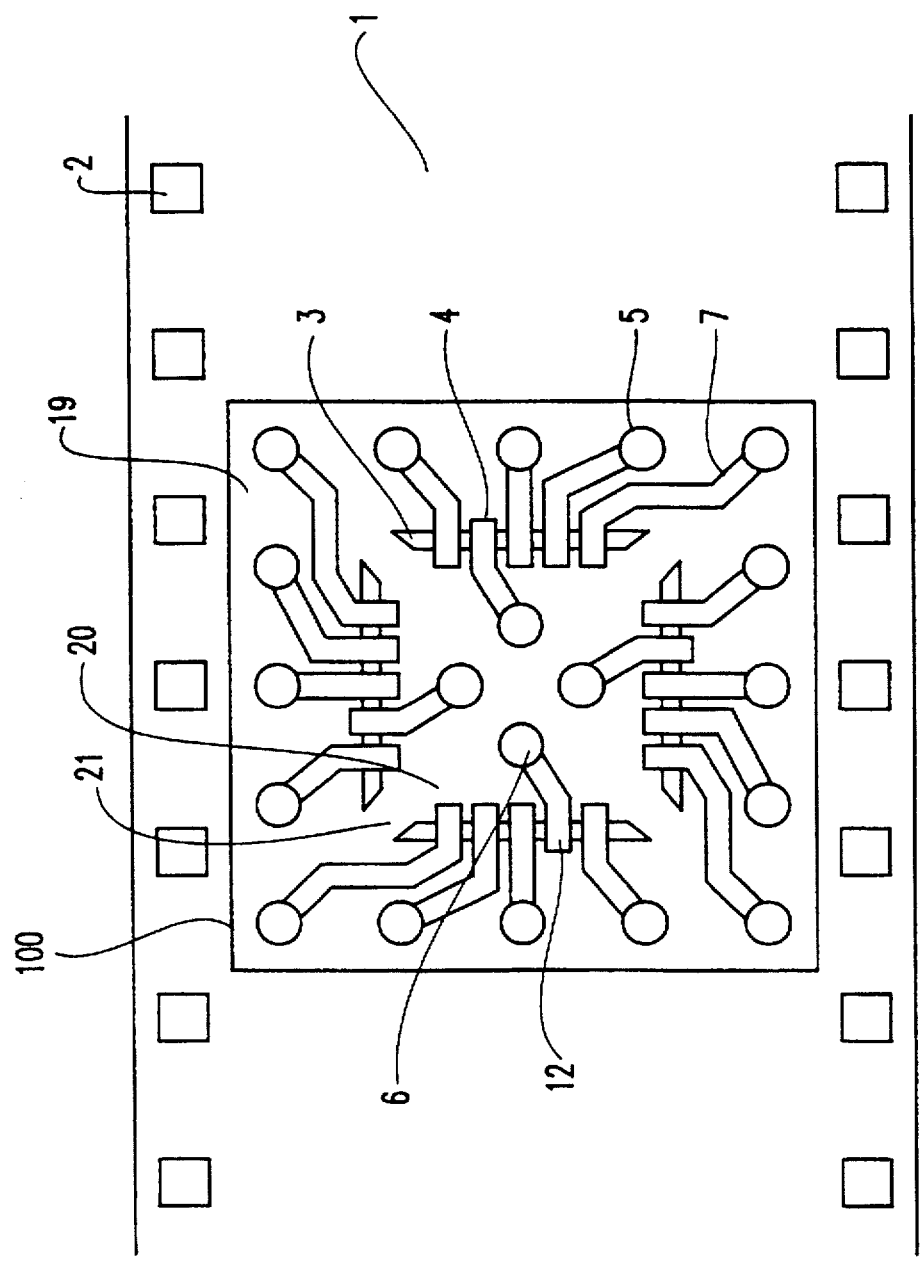
FIG. 1 shows a tape carrier according to a first embodiment of the present invention.

Referring to FIG. 1, a tape carrier 100 according to the first embodiment of the present invention is shown in an enlarged scale because the actual structures provided in the tape carrier 100 are too minute to illustrate. The dimensions of the structures in the tape carrier 100 are described below.

The tape carrier 100 is formed on a base film 1. On the base film 1, a plurality of tape carriers 100 are arranged longitudinally of the base film 1. The tape carriers are moved by winding the base film 1 with a sprocket. The teeth of the sprocket fit into sprocket holes 2 of the base film 1 in a conventional manner.

A plurality (e.g., four) narrow openings 3 are formed in the tape carrier 100 and are arranged in a rectangular shape. The openings 3 are formed at positions where terminals (e.g., pads or bumps) of a device (e.g., a semiconductor chip) are located when the device is mounted on the tape carrier 100. The openings 3 receive a thermode to bond the terminals of the device and leads 4 of the tape carrier 100.

The openings 3 divide the base film 1 into a peripheral region 19 and a center region 20. The center region 20 is covered with the device when the device is mounted on the tape carrier 100. The bridges 21 between adjacent ones of the openings 3 connect the center portion 20 to the peripheral portion 19.

Outer wiring lines 7 are provided in the peripheral region 19 of the base film 1.

First ends of the outer wiring lines 7 are connected to respective through-holes 5. The through-holes 5 connect the outer wiring lines 7 to terminals on the back surface of the tape carrier 100. Detailed structures of the through-holes 5 are described below.

The outer wiring lines 7 extend toward the center region 20, and second ends of the outer wiring lines 7 are connected to first ends of respective leads 4. The outer wiring lines 7 and the leads 4 are made of integrally-formed metal in the first embodiment.

Second ends of the leads 4 are attached to the center region 20 of the base film 1 so that the leads 4 bridge the openings 3.

Inner wiring lines 12 are provided in the center region 20 of the base film 1.

First ends of the inner wiring lines 12 are connected to respective through-holes 6. The through-holes 6 connect the inner wiring lines 12 to terminals on the back surface of the tape carrier 100. Detailed structures of the through-holes 6 are described below.

The inner wiring lines 12 extend toward the peripheral portion 19, and second ends of the inner wiring lines 12 are connected to first ends of respective leads 4. The inner wiring lines 12 and the leads 4 are made of integrally-formed metal in the first embodiment.

The second ends of the leads 4 are attached to the peripheral region 19 of the base film 1 so that the leads 4 bridge the openings 3.

Next, the structures of the through-holes 5 and 6 are described.

Figure 2:
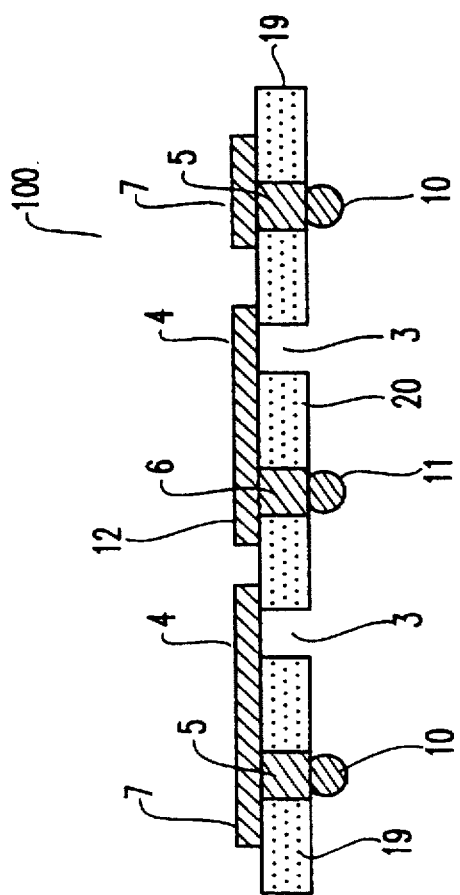
FIG. 2 is a sectional view of the tape carrier according to the first embodiment of the present invention.

Referring to FIG. 2, the through-holes 5 penetrate the base film 1 and connect the outer wiring lines 7 to terminals (e.g., pads or bumps) 10 on the back surface of the tape carrier 100. Similarly, the through-holes 6 connect the inner wiring lines 12 to terminals (e.g., pads or bumps) 11. Terminals 10 and 11 connect the tape carrier 100 to a substrate.

The openings 3 penetrate the tape carrier 100, to reach the leads 4. A thermode can be provided to reach the leads 4 from the back side of the tape carrier 1 through the openings 3.

Next, the materials preferably used for the respective portions of the tape carrier 100 are described.

The base film 1 is preferably made of polyimide-type materials, glass epoxy or polyester. Among those materials, polyimide-type materials are especially suitable when chemical etching is performed in a manufacturing process (described below) of the tape carrier 100 because of its corrosion-resistance.

The leads 4, the outer wiring lines 7 and the inner wiring lines 12 are preferably made of copper and their surfaces are preferably gold-plated.

The terminals 10 and 11 are preferably spheres of solder. Alternatively, they may be made copper or silver spheres that are solder-plated.

Next, the dimensions of the respective portions of the tape carrier 100 are described.

Figure 3A:
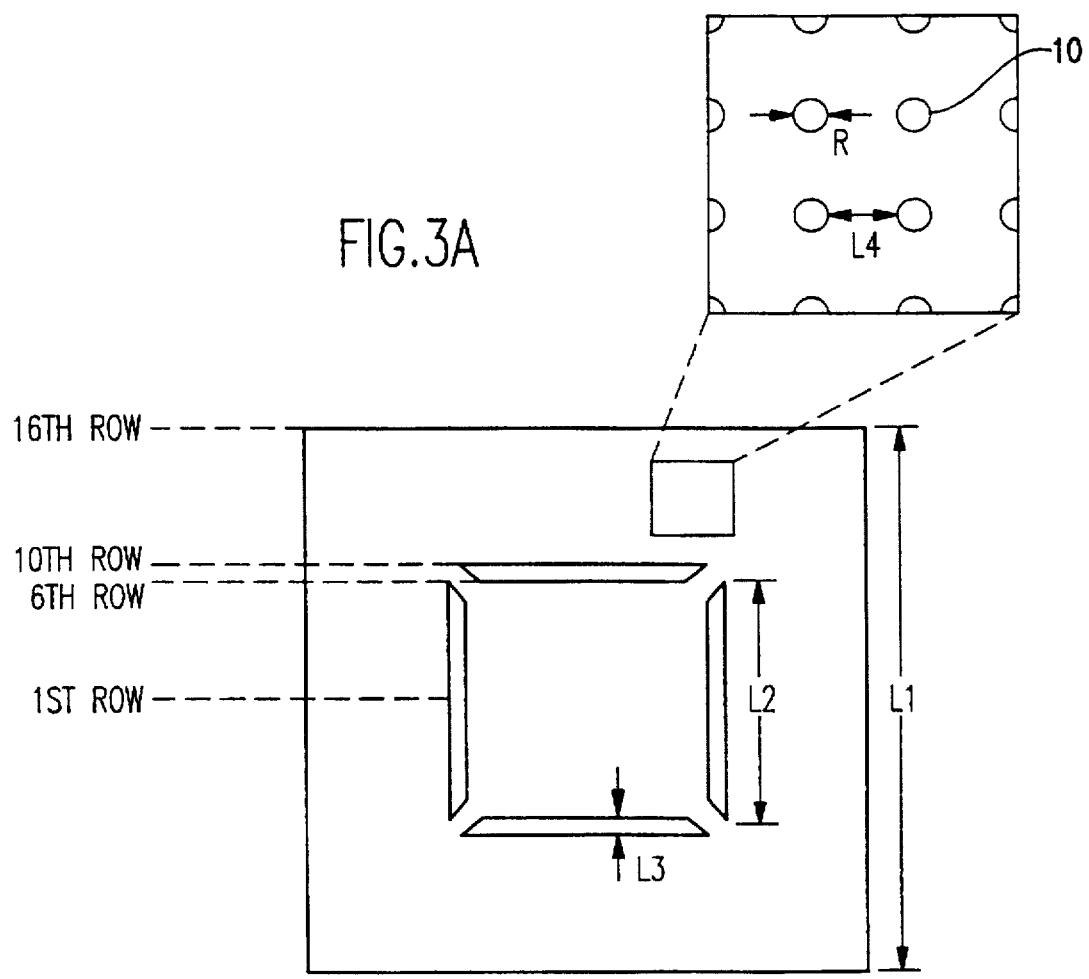
FIGS. 3(a) and 3(b) show the dimensions of respective parts of the tape carrier according to the first embodiment of the invention.

Referring to FIG. 3(a), in this embodiment, the tape carrier 100 preferably has a side length L1 of 38.1 mm.

The openings 3 preferably have a side length L2 of about 17 mm and a width L3 of about 0.8 mm.

The terminals 10 and 11 are arranged in a grid-like form having a pitch of 1.27 mm. The diameter of the terminals 10 and 11 is about 0.3 mm. The through-holes 5 and 6 preferably have a smaller diameter than that of the terminals 10 and 11.

Figure 3B:
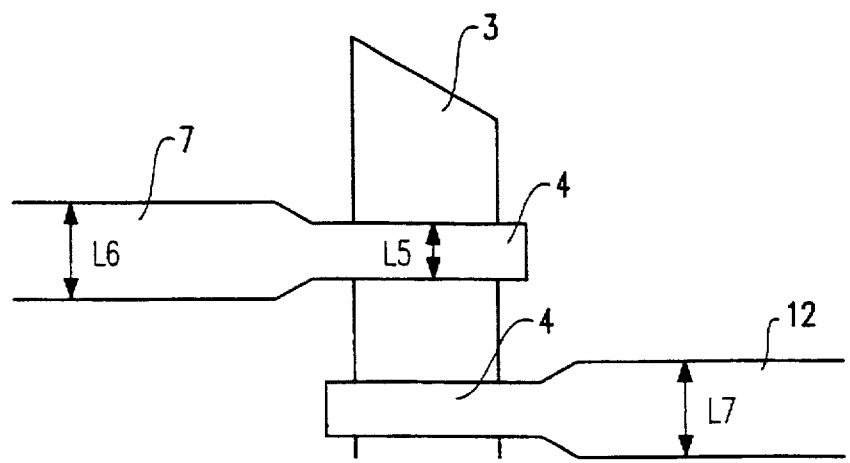

Referring to FIG. 3(b), the leads 4 preferably have a width L5 of 30 μm. A width L6 of the outer wiring lines 7 and a width L7 of the inner wiring lines 12 are preferably 40 μm.

If the terminals provided on the center line of the tape carrier 100 are assumed to be a first row, the terminals of the first to sixth rows are arranged in the center region 20 of the base film 1. The number of terminals in the center region 20 is 11×11=121. A terminal is not provided for the seventh to ninth rows because of the openings 3. The terminals of the 10th to 16th rows are arranged in the peripheral region 19 of the base film 1. The number of terminals in the peripheral region 19 is (31×31)−(17×17)=672. Thus, the total number of terminals provided on the tape carrier 100 is 121+672= 793.

Next is described the configuration of the tape carrier 100 when a semiconductor device is mounted thereon.

Figure 4:
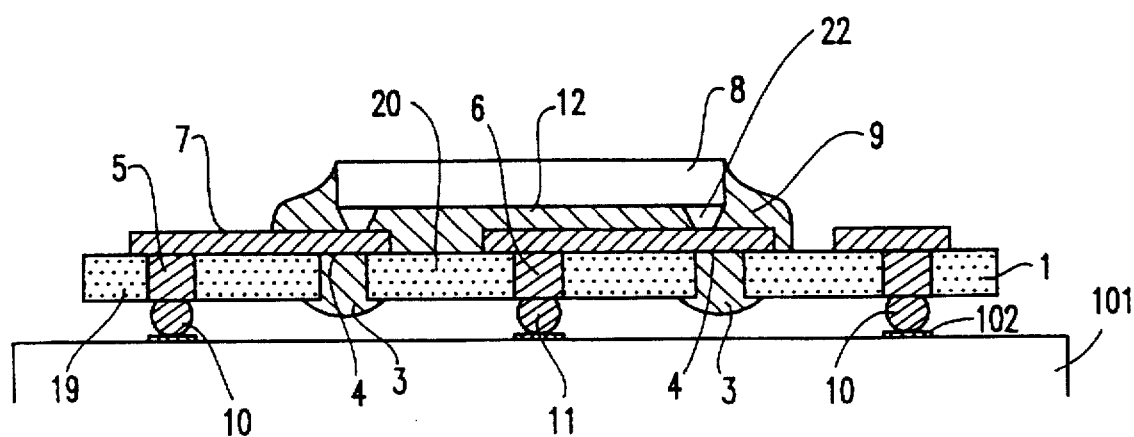
FIG. 4 is a sectional view of the tape carrier according to the first embodiment of the present invention when a device is mounted thereon.

Referring to FIG. 4, a device 8 (e.g., a semiconductor chip) is mounted on the center region 20 of the base film 1. Terminals 22 (e.g., gold bumps) are provided on the bottom face of the device 8. The terminals 22 and the leads 4 are connected together at the openings 3 by thermocompression bonding. The device 8 is encapsulated in a resin 9. The base film 1 is mounted on a substrate 101. The terminals 10 and 11 of the tape carrier 100 are connected to the terminals 102 of the substrate 101.

Two paths connect the device 8 to the substrate 101. The first path includes the terminals 10, the outer wiring lines 7, the leads 4 and the terminals 22. The second path includes the terminals 11, the inner wiring lines 12, the leads 4 and the terminals 22.

Next is described a process for manufacturing the tape carrier 100.

Figure 5A:
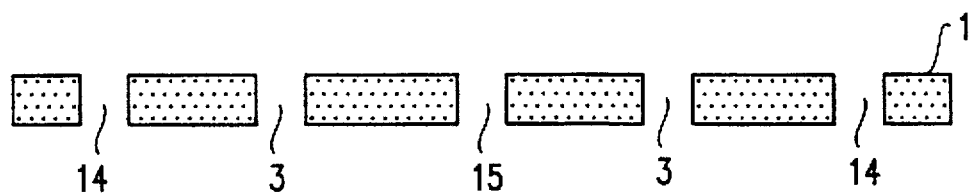
FIGS. 5(a)–5(d) show a process for manufacturing the tape carrier according to the first embodiment of the present invention.

Referring to FIG. 5(a), in the first step, the openings 3, holes 14 and holes 15 are formed in the base film 1 by punching by use of metal dies or the like. Chemical etching can also be used instead of punching. The holes 14 and 15 are provided for forming the through-holes 5 and 6, respectively.

Figure 5B:
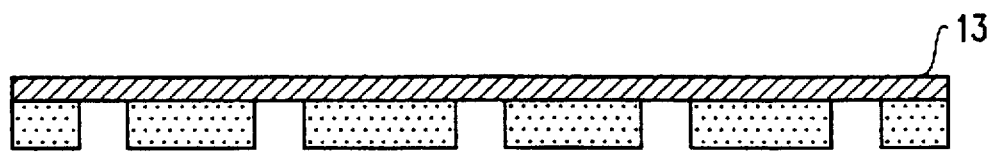

Referring to FIG. 5(b), in the second step, copper foil 13 is bonded to the base film 1.

Figure 5C:
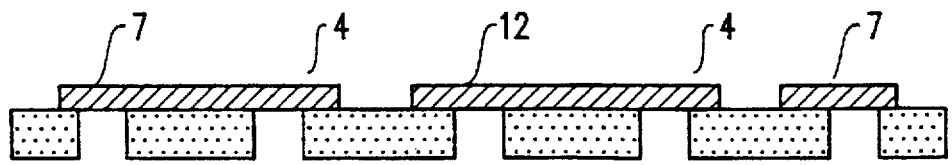

Referring to FIG. 5(c), in the third step, the copper foil 13 is etched to form the outer wiring lines 7, leads 4 and inner wiring lines 12. In this operation, the back surface of the tape carrier 100 is also coated with a resist to prevent the copper foil 13 from being etched with an etching liquid coming through the openings 3, holes 14 and 15.

Figure 5D:
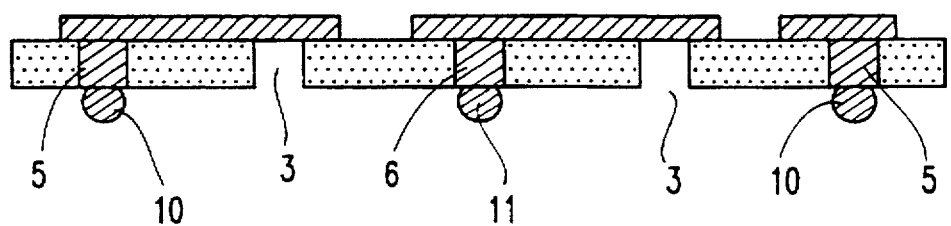

Referring to FIG. 5(d), in the fourth step, the inner walls of the holes 14 and 15 are plated to form the through-holes 5 and 6. Alternatively, the through-holes 5 and 6 may be formed by charging the holes 14 and 15 with solder. The terminals 10 and 11 are provided under the through-holes 5 and 6, respectively.

Next is described the process for mounting a device 8 on the tape carrier 100.

Figure 6A:
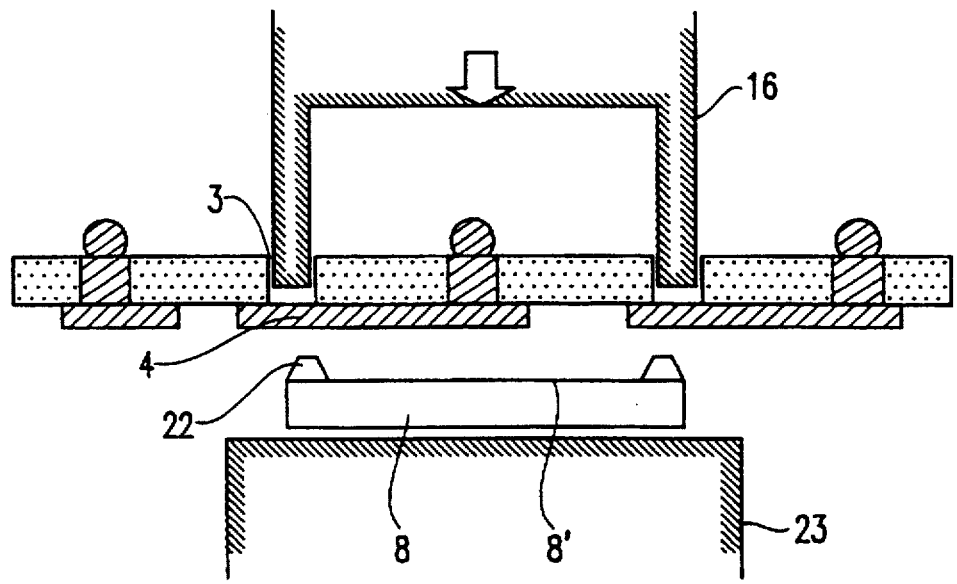
FIGS. 6(a) and 6(b) show a process for mounting a device on the tape carrier according to the first embodiment of the present invention.

Referring to FIG. 6(a), in the first step, a bonding stage 23 positions the device 8 so that the terminals 22 of the device 8 are opposed to the corresponding leads 4 at the openings 3.

After the positioning of the device 8, a U-shaped thermode 16 is inserted into the openings 3. The thermode 16 projects toward the device 8, and bonds the inner leads 4 to the terminals 22 by thermocompression bonding. Since the thermode 16 directly contacts inner leads 4 through the openings 3, this bonding operation can be performed easily. In addition, since an insulating film 8' is formed on the surface of the device 8, the bonding prevents shortcircuiting between the device 8 and the inner wiring lines 12. If necessary, an insulating treatment may be performed in advance on the wiring lines 12.

Figure 6B:
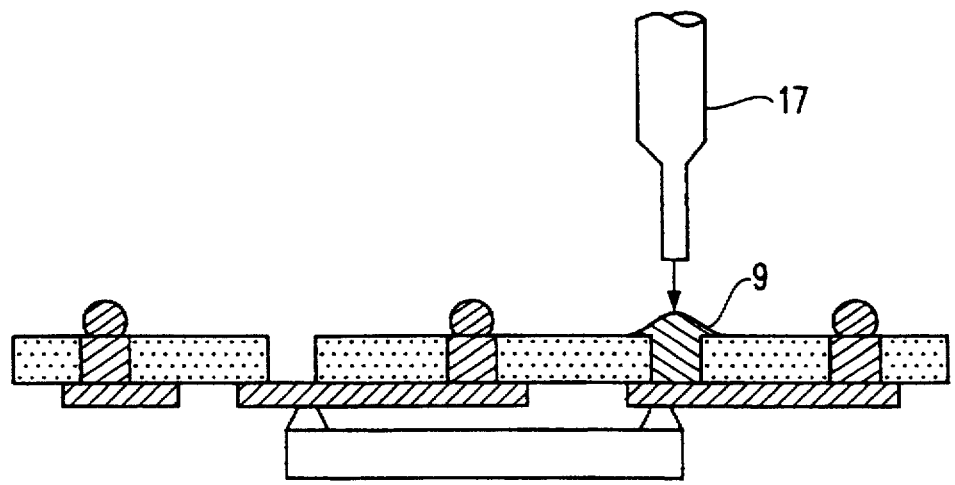

Referring to FIG. 6(b), in the second step, the device 8 is encapsulated in resin 9, which is supplied from a dispenser 17. Next, a modification of the first embodiment will be described.

In this embodiment, a power supply and the ground (not illustrated) are preferably connected to the wiring lines 12 to reduce power supply noise. By connecting the power supply and the ground to the inner wiring lines 12, connection lengths between the power supply and the device 8 and also between the ground and the device 8 are shortened. As a result, the inductance of the connection is reduced and, therefore, the power supply noise is reduced.

The structures provided in the center region 20 of the base film 1 are not limited to the wiring lines 12. Any structure may be provided so long as it does not affect the operation of the device 8.

The shape of the openings 3 is not limited to a narrow rectangular shape. Similarly, the arrangement of the openings 3 is not limited to a rectangular shape. The shape and arrangement of the openings 3 should be selectively determined in accordance with the arrangement of the terminals 22 of the device 8.

The advantages of the first embodiment are described below.

First, according to the first embodiment of the present invention, the center region 20 of the base film 1, as well as the peripheral region 19, can accommodate the terminals 11 for connection between the tape carrier 100 and the substrate 101. This arrangement results in an increased number of terminals between the tape carrier 100 and the substrate 101. This advantage is due to the narrow openings 3 for receiving the U-shaped thermode 16.

Second, the total wiring length within the tape carrier 100 is shortened because the inner wiring lines 12 are generally shorter than the outer wiring lines 7. Simultaneously, the tape carrier 100 can be downsized because the total number of terminals 10 in the peripheral region 19 is reduced.

Next is described an exemplary comparison of the conventional tape carrier and the tape carrier according to the first embodiment in view of the number of terminals and sizes of the carriers.

The conventional tape carrier is nearly equal to the first embodiment in the number of terminals if it accommodates the 10th to 17th rows of terminals in the peripheral region 19. Specifically, the number of terminals of this tape carrier is 800 (=(33×33)−(17×17)). This is nearly equal to the number of terminals of the first embodiment (e.g., 793).

The outer diameter and the maximum wiring length of this conventional tape carrier are 40.64 mm and about 33 mm, respectively. In contrast, the outer diameter and the maximum wiring length are preferably 38.1 mm and about 30 mm, respectively, in the first embodiment. That is, the outer diameter and the maximum wiring length have been shortened by 2 mm and 3 mm, respectively.

A third advantage of the first embodiment is the reduction of the power supply noise. This advantage is due to the power supply and the ground being collectively connected to the inner wiring lines 12, to reduce their inductance.

Fourthly, the first embodiment allows the leads 4 and the device 8 to be easily connected together. The leads 4 and the device 8 are connected by thermocompression bonding. The thermocompression bonding requires a smaller number of steps and requires less time for the connecting operation than that of other connecting methods such as solder reflowing. Further, by replacing the thermode with a U-shaped thermode 16, a conventional manufacturing apparatus can also be used.

Next, a second embodiment of the present invention is described in which the leads 4 are modified. The structures of the other parts of the second embodiment are the same as those in the first embodiment.

Figure 7:
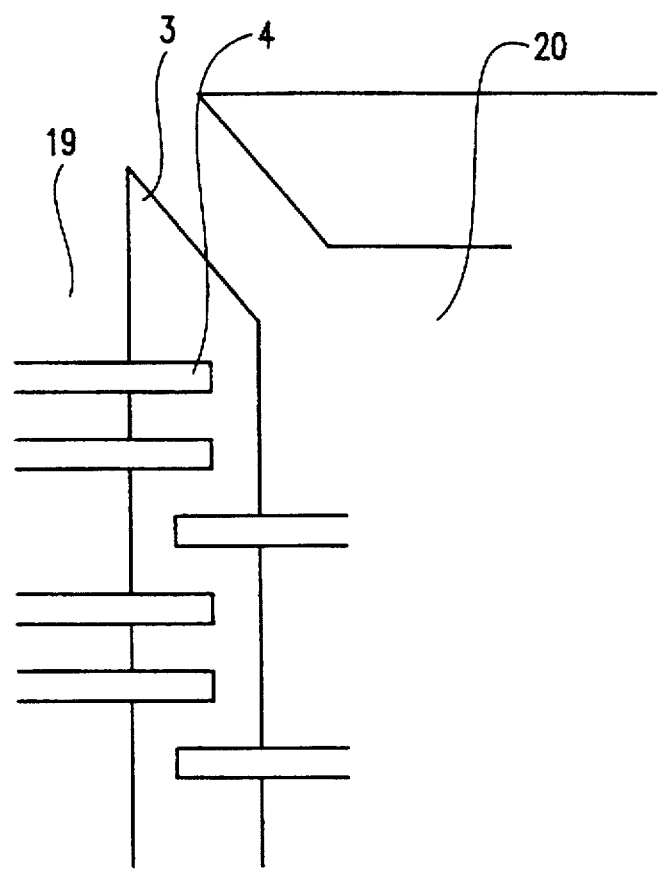
FIG. 7 is an enlarged plan view of inner leads of a tape carrier according to a second embodiment of the present invention.

Referring to FIG. 7, in the second embodiment, the leads 4 extend to the openings 3 but do not bridge the openings. Thus, the ends of the leads 4 are made free above the openings 3.

In the second embodiment, since the leads 4 have free ends, the leads 4 flexibly follow the thermocompression bonding operation. Therefore, the thermocompression bonding operation can be performed more easily than that of the first embodiment.

Next, a third embodiment of the present invention is described in which a structure is provided on the center region 20 of the base film 1. Specifically, a wiring plane 18 is provided on the center region 20 instead of the inner wiring lines 12. The structures of the other parts of the third embodiment are the same as those in the first embodiment.

Figure 8:
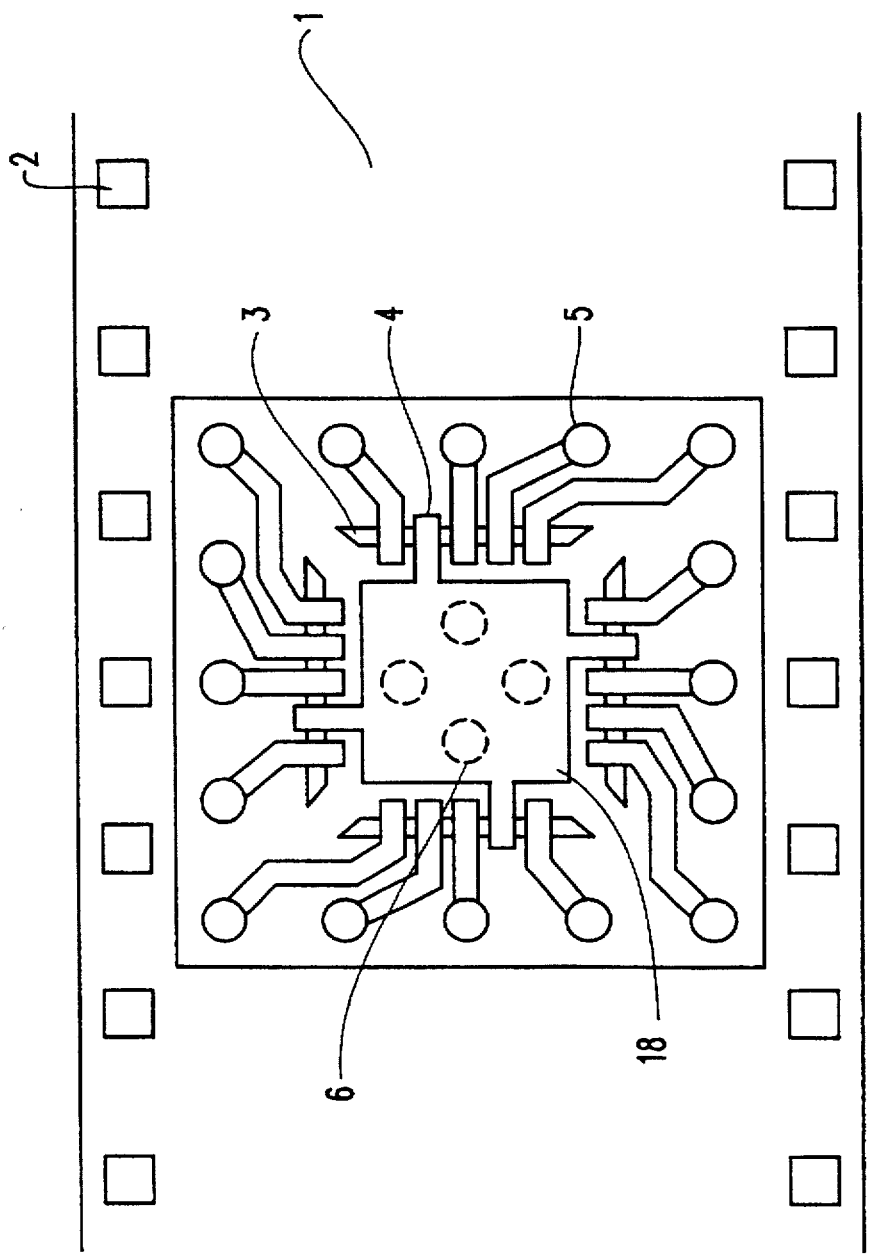
FIG. 8 shows a tape carrier according to a third embodiment of the present invention.

Referring to FIG. 8, the wiring plane 18 is provided on the center region 20 and is connected to the terminals 11 on the back surface of the tape carrier 100 through the through-holes 6. The wiring plane 18 is connected to a power supply or the ground via the terminals 11 (shown in FIG. 2).

In this embodiment, the power supply noise is further reduced because the inductance of a line connecting a power source or the ground and the device 8 is reduced by the wiring plane 18. In addition, the wiring plane 18 acts as a shield against external electromagnetic waves.

The invention may be embodied in other specific forms without departing from the spirit or essential characteristics thereof. For example, there are no limitations on the structures provided on the center region 20 of the base film 1. Further, the features of the respective embodiments may be combined. For example, the inner wiring lines 12 and the wiring plane 18 may both be provided on the center region 20.

The present embodiments are therefore, to be considered in all respects as illustrative and not restrictive, the scope of the invention being indicated by the appended claims rather than by the foregoing description and all changes which come within the meanings and range of equivalency of the claims are therefore intended to the embraced therein.

What is claimed is:

1. A tape carrier for receiving a device, comprising:
    a film having first and second surfaces and including first and second regions, said first region of said first surface of said film for being covered with said device, said film having an opening between said first and second regions of said film;
    a first lead positioned on said first surface of said film, said first lead extending across said opening of said film, said first lead for being coupled to said device at said opening of said film;
    a first terminal positioned on said second surface in said first region of said film;
    a first connection between said first lead and said first terminal;
    a second lead positioned on said first surface of said film, said second lead extending across said opening of said film, said second lead for being coupled to said device at said opening of said film;
    a second terminal positioned on said second surface in said second region of said film; and
    a second connection between said second lead and said second terminal.

2. A tape carrier according to claim 1, wherein said first connection comprises a first wiring positioned on said first surface in said first region of said film and a first through-hole in said film connecting said first wiring to said first terminal.

3. A tape carrier according to claim 2, wherein said first wiring comprises a wiring plate.

4. A tape carrier according to claim 1, wherein said second connection comprises a second wiring positioned on said first surface in said second region of said film and a second through-hole in said film connecting said second wiring to said second terminal.

5. A tape carrier according to claim 1, wherein said first lead bridges said opening.

6. A tape carrier according to claim 1, wherein a first end of said first lead includes a free end positioned partially over said opening.

7. A tape carrier according to claim 1, wherein said tape carrier has a plurality of said first terminals, and said plurality of said first terminals are arranged in a grid.

8. A tape carrier according to claim 1, wherein said tape carrier has a plurality of said first terminals and a plurality of said second terminals, and said plurality of said first terminals and said plurality of said second terminals are arranged in a grid.

9. A tape carrier according to claim 1, wherein said tape carrier has a plurality of said openings and said plurality of said openings are arranged in a rectangular shape.

10. A tape carrier according to claim 9, wherein said first region of said film is surrounded by said plurality of said openings.

11. A tape carrier as in claim 1, wherein said first lead has a length less than that of said second lead.

12. A tape carrier as in claim 1, wherein said first lead and said second lead each include a first portion positioned across said opening and a second portion positioned other than across said opening, wherein said first portion has a thickness less than that of said second portion.

13. A tape carrier for receiving a device, comprising:

a film having first and second surfaces and including first and second regions, said first region of said first surface of said film for being covered with said device, said film having an opening between said first and second regions of said film;

a first lead positioned on said first surface of said film, said first lead extending across said opening of said film, said first lead for being coupled to said device at said opening of said film;

a first terminal positioned on said second surface in said first region of said film; and a first connection between said first lead and said first terminal, said tape carrier being adapted for connection to one of a power supply and a ground, wherein said first terminal is for connection to said one of said power supply and said ground.

14. A tape carrier as in claim 13, further comprising:

a second terminal positioned in said second region; and a second lead connected to said second terminal and extending across said opening for being connected to said device, wherein said first lead has a length less than that of said second lead.

15. A tape carrier prepared by a process comprising steps of:

(a) forming an opening and at least two holes in a film, said film having a first surface, a first region and a second region, said first region for being connected to a device, a first hole of said holes being formed in said first region and a second hole of said holes being formed in said second region;

(b) attaching a first surface of a foil to said first surface of said film;

(c) applying a resist over said foil, said resist being applied to said first surface of said foil through said opening and said hole of said film;

(d) etching said foil to form at least two leads extending across said opening of said film and wirings connected to said leads; and (e) applying a conductive material into said holes of said film to form through-holes connected to said wirings.

16. A tape carrier for receiving a device, comprising:

a film having first and second surfaces and including first and second regions, said first region of said first surface of said film for being covered with said device, said film having an opening between said first and second regions of said film;

first lead positioned on said first surface of said film, said first lead extending across said opening of said film, said first lead for being coupled to said device at said opening of said film;

a first terminal positioned on said second surface in said first region of said film;

a first connection between said first lead and said first terminal; and a resin for encapsulating said device.

17. A structure for mounting a device on a substrate, comprising:

a film having first and second surfaces and including first and second regions, said first region of said first surface of said film for being covered with said device, said film having an opening between said first and second regions;

a first lead positioned on said first surface of said film, said first lead extending across said opening of said film, said first lead for being coupled to said device at said opening of said film;

a first terminal connected to said substrate, said first terminal being positioned on a second surface in said first region of said film; and a first connection between said first lead and said first terminal;

a second lead positioned on said first surface of said film, said second lead extend across said opening of said film, said second lead for being coupled to said device at said opening of said film;

a second terminal positioned on said second surface in said second region of said film; and a second connection between said second lead and said second terminal.

18. A structure for mounting a device on a substrate according to claim 17, wherein said first connection comprises a first wiring positioned on said first surface in said first region of said film and a first through-hole in said film connecting said first wiring to said first terminal.

19. A structure for mounting a device on a substrate according to claim 18, wherein said second connection comprises a second wiring positioned on said first surface in said second region of said film and a second through-hole in said film connecting said second wiring to said second terminal.

20. A tape carrier as in claim 17, wherein said first lead has a length less than that of said second lead.

* * * * *